United States Patent
Tsai et al.

(10) Patent No.: US 9,182,426 B2
(45) Date of Patent: Nov. 10, 2015

(54) CURRENT SENSING CIRCUIT AND METHOD THEREOF

(71) Applicant: INDUSTRIAL TECHNOLOGY RESEARCH INSTITUTE, Hsinchu (TW)

(72) Inventors: Hsuan-Yu Tsai, Taichung (TW); Kai-Cheung Juang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 106 days.

(21) Appl. No.: 13/963,076

(22) Filed: Aug. 9, 2013

(65) Prior Publication Data

US 2014/0159711 A1    Jun. 12, 2014

(30) Foreign Application Priority Data

Dec. 10, 2012    (TW) .............................. 101146435 A

(51) Int. Cl.
    *G01R 33/12* (2006.01)
    *G01R 15/14* (2006.01)

(52) U.S. Cl.
    CPC ................................... *G01R 15/148* (2013.01)

(58) Field of Classification Search
    CPC ...... G01R 33/02; G01R 15/148; G01R 19/00; G01R 35/005; G01R 1/06788; G01R 33/09; G01R 33/093; G01R 19/0092; G01R 33/12; G11B 5/3932; G11B 5/372; G11B 5/376; G01N 27/72
    USPC .................. 324/228, 117 R, 117 H, 348, 522, 324/754.26, 713, 177, 127
    See application file for complete search history.

(56) References Cited

U.S. PATENT DOCUMENTS

| 5,773,991 | A  | 6/1998 | Chen           |
| 6,181,198 | B1 | 1/2001 | Poletto et al. |
| 6,362,698 | B1 | 3/2002 | Gupta          |

(Continued)

FOREIGN PATENT DOCUMENTS

| TW | 200712510    | 4/2007 |
| TW | 201012074    | 3/2010 |
| TW | 201023525    | 6/2010 |
| TW | 201100835 A1 | 1/2011 |
| TW | I339471      | 3/2011 |
| TW | I340541      | 4/2011 |

OTHER PUBLICATIONS

English Abstract translation of TWI340541 (Published Apr. 11, 2011).

(Continued)

*Primary Examiner* — Son Le
(74) *Attorney, Agent, or Firm* — McClure, Qualey & Rodack, LLP

(57) ABSTRACT

A current sensing circuit comprises a high frequency signal generator, an electromagnetic exchanger, and a demodulation circuit. The high frequency signal generator generates a high frequency signal. The electromagnetic exchanger couples to the high frequency signal generator, and receives the high frequency signal to generate a high frequency magnetic field. The high frequency magnetic field modulates the magnetic field induced by a current to generate a modulated magnetic field. The electromagnetic exchanger induces the modulated magnetic field to output a modulated signal. The demodulation circuit couples to the electromagnetic exchanger, and performs demodulation to output a sensing result according to the modulated signal.

16 Claims, 3 Drawing Sheets

(56) References Cited

U.S. PATENT DOCUMENTS

| | | | |
|---|---|---|---|
| 6,621,259 | B2 | 9/2003 | Jones et al. |
| 6,642,705 | B2 | 11/2003 | Kawase |
| 6,781,135 | B2 | 8/2004 | Berger |
| 6,781,359 | B2 | 8/2004 | Stauth et al. |
| 7,362,086 | B2 | 4/2008 | Dupuis et al. |
| 7,397,234 | B2 | 7/2008 | Alfano et al. |
| 7,679,162 | B2 | 3/2010 | Dupuis et al. |
| 7,990,132 | B2 | 8/2011 | Dupuis et al. |
| 8,476,900 | B2 | 7/2013 | Fan et al. |
| 2004/0263162 | A1 | 12/2004 | Kandori et al. |
| 2005/0212611 | A1 | 9/2005 | Muthali et al. |
| 2007/0188946 | A1 | 8/2007 | Shoji |
| 2007/0247141 | A1* | 10/2007 | Pastre et al. .......... 324/202 |
| 2007/0252577 | A1* | 11/2007 | Preusse ............ 324/117 R |
| 2008/0220733 | A1 | 9/2008 | McCune |

OTHER PUBLICATIONS

English Abstract translation of TW201012074 (Published Mar. 16, 2010).

English Abstract translation of TWI339471 (Published Mar. 21, 2011).

English Abstract translation of TW201023525 (Published Jun. 6, 2010).

Chen, et al.: "A New Type of Hall Current Sensor"; 978-1-4244-7935-1/11/$26.00 © 2011 IEEE.

Siskos, et al.: "Simple Built-In Current Sensor for Current Monitoring in Mixed-Signal Circuits"; IEEE Transactions Instrumentation and Measurement, vol. 46, No. 6, Dec. 1997; pp. 1301-1304.

Du, et al.: "An Integrated Speed- and Accuracy-Enhanced CMOS Current Sensor With Dynamically Biased Shunt Feedback for Current-Mode Buck Regulators"; IEEE Transactions on Circuits and Systems—I: Regular Papers, vol. 57, No. 10, Oct. 2010; pp. 2804-2814.

Man, et al.: "Design of Fast-Response On-Chip Current Sensor for Current-Mode Controlled Buck Converters with MHz Switching Frequency"; 1-4244-0637-4/07/$20.00 © C2007 IEEE; pp. 389-392.

McNeill, et al.: "High-Fidelity Low-Cost Electronic Current Sensor for Utility Power Metering"; IEEE Transactions on Power Delivery, vol. 26, No. 4, Oct. 2011; pp. 2309-2317.

Kim, et al.: "Phase Current Reconstruction for AC Motor Drives using a DC Link Single Current Sensor and Measurement Voltage Vectors"; 0-7803-9033-4/05/$20.00 © 2005 IEEE.; pp. 1346-1352.

Tw Office Action dated May 1, 2014.

* cited by examiner

CURRENT SENSING CIRCUIT AND METHOD THEREOF

CROSS-REFERENCE TO RELATED APPLICATION

This application claims the benefit of Taiwan application Serial No. 101146435, filed Dec. 10, 2012, the subject matter of which is incorporated herein by reference.

TECHNICAL FIELD

The disclosure relates in general to a sensing circuit and a sensing method thereof, and more particularly to a current sensing circuit for sensing a current.

BACKGROUND

Current sensing technique is widely applied to various fields, such as motor monitoring, energy measuring, and the protection of lighting equipment and so on. Current sensing technique is mainly classified into two categories: intrusive current sensing technique and non-intrusive current sensing technique. The intrusive current sensing technique is to insert an additional element into current path of a device under test, so that the information of the current can be obtained from the voltage drop or the current induced due to the current change on the additional element.

Non-intrusive current sensing technique is not required to insert an additional element into current path of a device under test. It utilizes the magnetic effect of current to produce magnetic fields around a wire which current flows, and converts the magnetic fields to electrical signals with an element capable of sensing the magnetic fields.

SUMMARY

The disclosure is directed to a current sensing technique for sensing a current.

According to an embodiment of the present disclosure, a current sensing circuit is provided. The current sensing circuit comprises a high frequency signal generator, an electromagnetic exchanger and a demodulation circuit. The high frequency signal generator generates a high frequency signal. The electromagnetic exchanger couples to the high frequency generator, and receives the high frequency signal to generate a high frequency magnetic field. The high frequency magnetic field modulates a magnetic field induced by a current to generate a modulated magnetic field. The electromagnetic exchanger induces the modulated magnetic field to output a modulated signal. The demodulation circuit couples to the electromagnetic exchanger, and performs demodulation to output a sensing result according to the modulated signal.

According to another embodiment of the present disclosure, a method of current sensing is provided. The method of current sensing comprises the following steps. Generating a high frequency signal. Receiving the high frequency signal to generate a high frequency magnetic field. The high frequency magnetic field modulates a magnetic field induced by a current to generate a modulated magnetic field. Inducing the modulated magnetic field to output a modulated signal. Performing demodulation to output a sensing result according to the modulated signal.

The above and other aspects of the disclosure will become better understood with regard to the following detailed description of the preferred but non-limiting embodiments. The following description is made with reference to the accompanying drawings.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION

Figure 1:
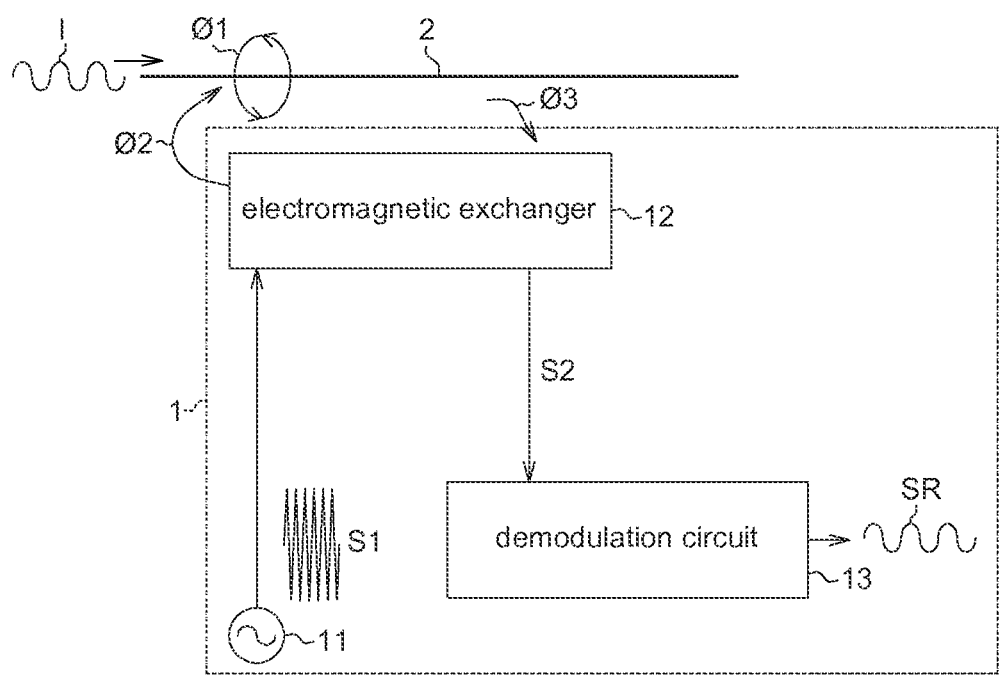
FIG. 1 is a schematic diagram showing a current sensing circuit.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
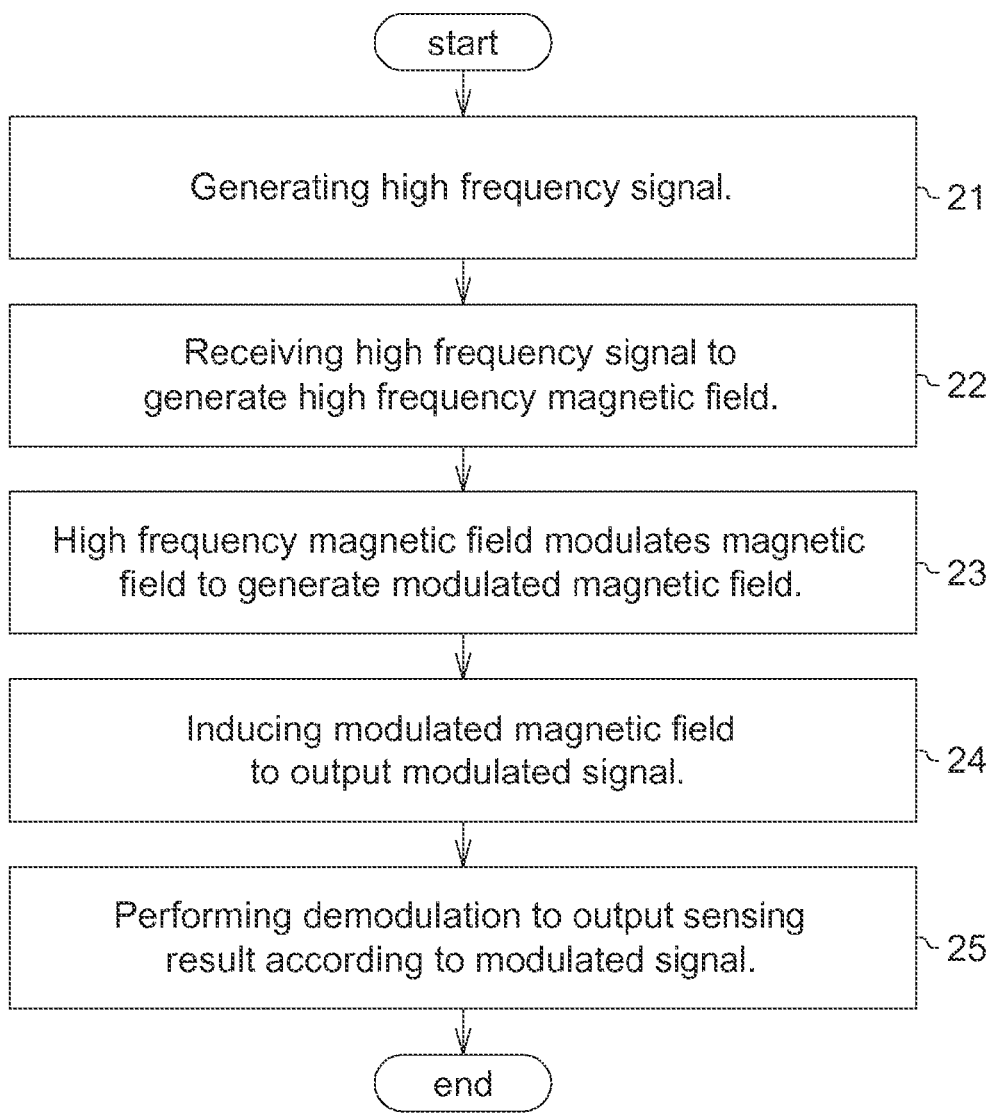
FIG. 2 is a flow chart showing a method of current sensing.

Referring simultaneously to FIGS. 1 and 2. FIG. 1 is a schematic diagram showing a current sensing circuit according to an embodiment of the disclosure. FIG. 2 is a flow chart showing a method of current sensing according to the embodiment of the disclosure. Current sensing circuit 1 detects a current I. The current I flowing through a conductor 2 can generate a magnetic field $\phi 1$. Current sensing circuit 1 comprises a high frequency signal generator 11, an electromagnetic exchanger 12 and a demodulation circuit 13. The electromagnetic exchanger 12 couples to the high frequency signal generator 11. The demodulation circuit 13 couples to the electromagnetic exchanger 12. A method of current sensing, applied to the current sensing circuit 1, comprises the following steps.

At step 21, the high frequency signal generator 11 generates a high frequency signal S1. The high frequency signal S1 has a high frequency compared to the frequency of the current I. The high frequency signal S1 may be, for example, a high frequency voltage signal. At step 22, the electromagnetic exchanger 12 receives the high frequency signal S1 to generate a high frequency magnetic field $\phi 2$. At step 23, the high frequency magnetic field $\phi 2$ modulates the induced magnetic field $\phi 1$ to generate a modulated magnetic field $\phi 3$. At step 24, electromagnetic exchanger 12 induces the modulated magnetic field $\phi 3$ to output the modulated signal S2. At step 25, the demodulation circuit 13 performs demodulation to output the sensing result SR according to the modulated signal S2, wherein the sensing result SR indicates the information of the current I.

Figure 3:
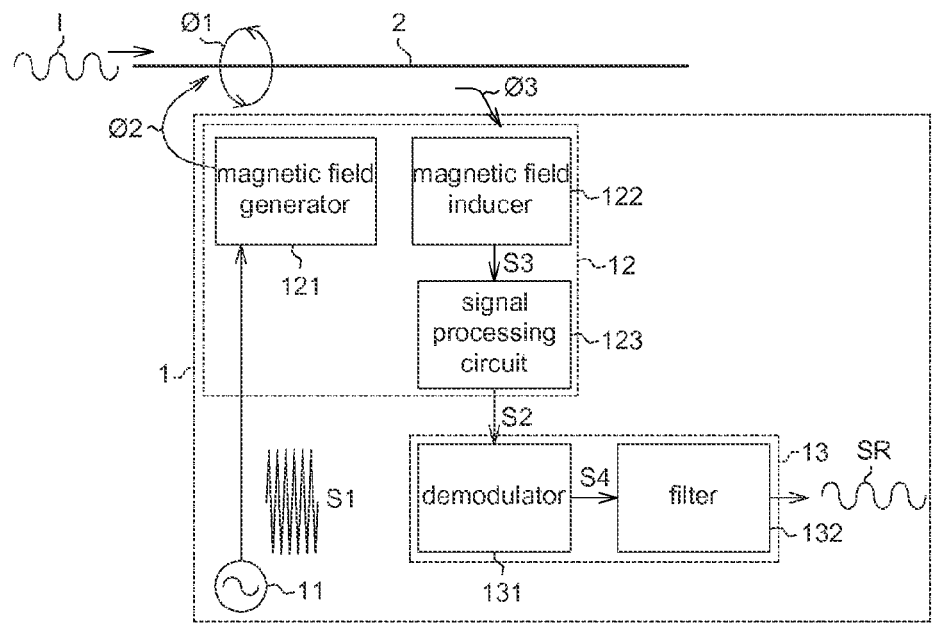
FIG. 3 is a detailed block diagram showing a current sensing circuit.

Referring to FIG. 3. FIG. 3 is a detailed block diagram showing the current sensing circuit according to the embodiment of the disclosure. The electromagnetic exchanger 12 further comprises a magnetic field generator 121, a magnetic field inducer 122 and a signal processing circuit 123. The demodulation circuit 13 comprises a demodulator 131 and a filter 132. The magnetic field generator 121 may be, for example, an element or a device capable of converting an electrical signal to a magnetic field, such as a coil, an inductor or a Rogowski coil. Moreover, the magnetic field generator 121 receives the high frequency signal S1 to generate the high frequency magnetic field $\phi 2$. The high frequency signal S1 makes the magnetic field generator 121 be operated at a state near to magnetic saturation, and causes a non-linear magnetic effect. Thus, the effect is close to modulation operation making the high frequency magnetic field $\phi 2$ and the induced magnetic field $\phi 1$ multiply by and add to each other. After incepting the high frequency magnetic field $\phi 2$ into the induced magnetic field $\phi 1$, the modulated magnetic field $\phi 3$ can then be generated.

The magnetic field inducer 122 may be, for example, an element or a device capable of reacting to the magnetic field, such as a Hall effect sensor, a Magneto resistive sensor, a magnetic impedance unit, a coil, an inductor, or a Rogowski coil. The magnetic field inducer 122 induces the modulated magnetic field $\phi 3$ to output the induced signal S3. In one embodiment, the magnetic field generator 121 and the magnetic field inducer 122 may be two independent elements. In other embodiment, the magnetic field generator 121 and the magnetic field inducer 122 may be a single element. If the magnetic field generator 121 and the magnetic field inducer 122 are implemented as a single element, the single element is required to be capable of generating and inducing the magnetic field. The single element may be, for example, a coil, an inductor or a Rogowski coil.

The signal processing circuit 123, coupled to the magnetic field inducer 122 and the demodulator 131 of the demodulation circuit 13, converts the induced signal S3 to the modulated signal S2. The signal processing performed by the signal processing circuit 123 may depend on the magnetic field inducer 122 and the demodulator 131. For example, if the induced signal S3 outputted by the magnetic field inducer 122 is too small, the signal processing circuit 123 may amplify the induced signal S3 to obtain a modulated signal S2 which is acceptable by the demodulator 131. Alternatively, if the induced signal S3 is not a kind of signal that can be processed by the demodulator 131, the signal processing circuit 123 may convert the induced signal S3 to a modulated signal S2 which is processable by the demodulator 131. In one embodiment, the magnetic field inducer 122 and the signal processing circuit 123 may be two independent elements. In other embodiment, the magnetic field inducer 122 and the signal processing circuit 123 may be a single element. The signal processing circuit 123 may be further integrated into the magnetic field inducer 122.

The demodulator 131 demodulates the modulated signal S2 to output a demodulated signal S4. The filter 132, coupled to the demodulator 131, may be, for example, a low pass filter. Generally, during the process of demodulation, unnecessary harmonic components may be generated. Filter 132 filters the harmonic components of the demodulated signal S4 to output the sensing result SR. In other embodiment, if the harmonic components of the demodulated signal S4 are within a permissible range, it is not required to use the filter 132, and the demodulated signal S4 may be taken as the sensing result SR.

Figure 4:
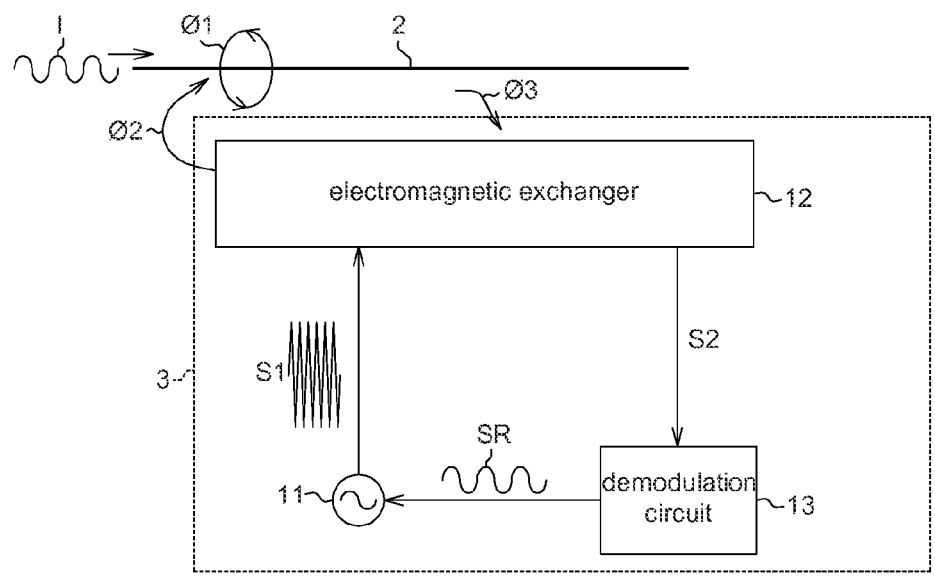
FIG. 4 is a schematic diagram showing a current sensing circuit.

Referring simultaneously to FIGS. 1 and 4, FIG. 4 is a schematic diagram showing a current sensing circuit according to another embodiment of the disclosure. The difference between the current sensing circuit 3 and the current sensing circuit 1 is that the demodulation circuit 13 feedbacks the sensing result SR to the high frequency signal generator 11, such that the high frequency signal generator 11 may adjust the high frequency signal S1 according to sensing result SR.

While the disclosure has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A current sensing circuit, comprising:
    a high frequency signal generator, for generating a high frequency signal;
    an electromagnetic exchanger, coupled to the high frequency signal generator, receives the high frequency signal to generate a high frequency magnetic field, wherein the high frequency magnetic field modulates a magnetic field induced by a current to generate a modulated magnetic field such that non-linear coupling between modulations of the high frequency magnetic field and the magnetic field induced by the current is exhibited, and the electromagnetic exchanger induces the modulated magnetic field to output a modulated signal; and
    a demodulation circuit, coupled to the electromagnetic exchanger, performs demodulation to output a sensing result according to the modulated signal.

2. The current sensing circuit according to claim 1, wherein the electromagnetic exchanger comprises:
    a magnetic field generator, for receiving the high frequency signal to generate the high frequency magnetic field; and
    a magnetic field inducer, for inducing the modulated magnetic field to output an induced signal.

3. The current sensing circuit according to claim 2, further comprising:
    a signal processing circuit, coupled to the magnetic field inducer and the demodulation circuit, converts the induced signal to the modulated signal.

4. The current sensing circuit according to claim 3, wherein the demodulation circuit comprises:
    a demodulator, coupled to the signal processing circuit, demodulates the modulated signal to output a demodulated signal; and
    a filter, coupled to the demodulator, filters harmonic components of the demodulated signal to output the sensing result.

5. The current sensing circuit according to claim 3, wherein the demodulation circuit comprises:
    a demodulator, coupled to the signal processing circuit, demodulates the modulated signal to output a demodulated signal, wherein the demodulated signal is taken as the sensing result.

6. The current sensing circuit according to claim 3, wherein the signal processing circuit is integrated into the magnetic field inducer.

7. The current sensing circuit according to claim 2, wherein the magnetic field generator is a coil, an inductor or a Rogowski coil.

8. The current sensing circuit according to claim 2, wherein the magnetic field inducer is a Hall effect sensor, a Magneto resistive sensor, a magnetic impedance unit, a coil, an inductor, or a Rogowski coil.

9. The current sensing circuit according to claim 1, wherein the demodulation circuit comprises:
    a demodulator, for demodulating the modulated signal to output a demodulated signal; and
    a filter, coupled to the demodulator, filters harmonic components of the demodulated signal to output the sensing result.

10. The current sensing circuit according to claim 1, wherein the demodulation circuit comprises:

a demodulator, for demodulating the modulated signal to output a demodulated signal, wherein the demodulated signal is taken as the sensing result.

11. The current sensing circuit according to claim 1, wherein the high frequency signal generator adjusts the high frequency signal according to the sensing result.

12. A method of current sensing, comprising:
generating a high frequency signal;
receiving the high frequency signal to generate a high frequency magnetic field;
the high frequency magnetic field modulates a magnetic field induced by a current to generate a modulated magnetic field such that non-linear coupling between modulations of the high frequency magnetic field and the magnetic field induced by the current is exhibited;
inducing the modulated magnetic field to output a modulated signal; and
performing demodulation to output a sensing result according to the modulated signal.

13. The method of current sensing according to claim 12, wherein the step of inducing comprises:
inducing the modulated magnetic field to output an induced signal; and
converting the induced signal to the modulated signal.

14. The method of current sensing according to claim 12, wherein the step of performing demodulation comprises:
demodulating the modulated signal to output a demodulated signal; and
filtering harmonic components of the demodulated signal to output the sensing result.

15. The method of current sensing according to claim 12, wherein the step of performing demodulation comprises:
demodulating the modulated signal to output a demodulated signal, wherein the demodulated signal is taken as the sensing result.

16. The method of current sensing according to claim 12, further comprising:
adjusting the high frequency signal according to the sensing result.

* * * * *